(12) United States Patent
Syu et al.

(10) Patent No.: US 8,683,295 B1
(45) Date of Patent: Mar. 25, 2014

(54) HYBRID DRIVE WRITING EXTENDED ERROR CORRECTION CODE SYMBOLS TO DISK FOR DATA SECTORS STORED IN NON-VOLATILE SEMICONDUCTOR MEMORY

(75) Inventors: Mei-Man L. Syu, Fremont, CA (US); Virgil V. Wilkins, Perris, CA (US); Alan T. Meyer, Anaheim Hills, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 287 days.

(21) Appl. No.: 13/166,728

(22) Filed: Jun. 22, 2011

Related U.S. Application Data

(60) Provisional application No. 61/378,869, filed on Aug. 31, 2010.

(51) Int. Cl.
*G11C 29/00* (2006.01)
*G06F 11/00* (2006.01)
*H03M 13/00* (2006.01)

(52) U.S. Cl.
USPC .......................................... 714/763; 714/746

(58) Field of Classification Search
USPC ......... 714/746, 758, 784, 766, 770, 777, 782, 714/781, 799, 52, 801, 763; 365/185.33, 365/230.03; 711/103, 112, 113; 369/53.1
See application file for complete search history.

(56) References Cited

U.S. PATENT DOCUMENTS

| | | | |
|---|---|---|---|
| 5,333,138 A | 7/1994 | Richards et al. | |
| 5,581,785 A | 12/1996 | Nakamura et al. | |
| 5,586,291 A | 12/1996 | Lasker et al. | |
| 5,668,976 A * | 9/1997 | Zook | 703/24 |
| 6,018,626 A * | 1/2000 | Zook | 703/24 |
| 6,044,439 A | 3/2000 | Ballard et al. | |
| 6,115,200 A | 9/2000 | Allen et al. | |
| 6,275,949 B1 | 8/2001 | Watanabe | |
| 6,429,990 B2 | 8/2002 | Serrano et al. | |
| 6,661,591 B1 | 12/2003 | Rothberg | |
| 6,662,267 B2 | 12/2003 | Stewart | |
| 6,687,850 B1 | 2/2004 | Rothberg | |
| 6,754,021 B2 | 6/2004 | Kisaka et al. | |
| 6,807,630 B2 | 10/2004 | Lay et al. | |
| 6,909,574 B2 | 6/2005 | Aikawa et al. | |
| 6,968,450 B1 | 11/2005 | Rothberg et al. | |
| 7,017,037 B2 | 3/2006 | Fortin et al. | |
| 7,028,174 B1 | 4/2006 | Atai-Azimi et al. | |
| 7,082,494 B1 * | 7/2006 | Thelin et al. | 711/112 |
| 7,107,444 B2 | 9/2006 | Fortin et al. | |

(Continued)

OTHER PUBLICATIONS

Hannes Payer, Marco A.A. Sanvido, Zvonimir Z. Bandic, Christoph M. Kirsch, "Combo Drive: Optimizing Cost and Performance in a Heterogeneous Storage Device", http://csl.cse.psu.edu/wish2009_papers/Payer.pdf.

(Continued)

*Primary Examiner* — Phung M Chung

(57) ABSTRACT

A hybrid drive is disclosed comprising a head actuated over a disk, and a non-volatile semiconductor memory (NVSM). A write command is received from a host, the write command comprising data. First and second error correction code (ECC) symbols are generated over the data, wherein the second ECC symbols are different than the first ECC symbols. The data and first ECC symbols are written to the NVSM, and the second ECC symbols are written to the disk.

26 Claims, 8 Drawing Sheets

(56) References Cited

U.S. PATENT DOCUMENTS

| | | | |
|---|---|---|---|
| 7,120,806 B1 | 10/2006 | Codilian et al. | |
| 7,142,385 B2 | 11/2006 | Shimotono et al. | |
| 7,231,585 B2 * | 6/2007 | Vainsencher et al. | 714/784 |
| 7,296,213 B2 * | 11/2007 | Vainsencher et al. | 714/784 |
| 7,334,082 B2 | 2/2008 | Grover et al. | |
| 7,395,452 B2 | 7/2008 | Nicholson et al. | |
| 7,411,757 B2 | 8/2008 | Chu et al. | |
| 7,461,202 B2 | 12/2008 | Forrer, Jr. et al. | |
| 7,472,222 B2 | 12/2008 | Auerbach et al. | |
| 7,477,477 B2 | 1/2009 | Maruchi et al. | |
| 7,509,471 B2 | 3/2009 | Gorobets | |
| 7,516,346 B2 | 4/2009 | Pinheiro et al. | |
| 7,610,438 B2 | 10/2009 | Lee et al. | |
| 7,613,876 B2 | 11/2009 | Bruce et al. | |
| 7,644,231 B2 | 1/2010 | Recio et al. | |
| 7,685,360 B1 | 3/2010 | Brunnett et al. | |
| 7,752,491 B1 | 7/2010 | Liikanen et al. | |
| 7,844,880 B2 * | 11/2010 | Vainsencher et al. | 714/764 |
| 7,904,790 B2 * | 3/2011 | Lee et al. | 714/763 |
| 7,925,200 B1 * | 4/2011 | Ward | 434/350 |
| 8,019,914 B1 * | 9/2011 | Vasquez et al. | 710/36 |
| 8,112,692 B2 * | 2/2012 | Lee et al. | 714/763 |
| 8,341,339 B1 * | 12/2012 | Boyle et al. | 711/103 |
| 2006/0195657 A1 | 8/2006 | Tien et al. | |
| 2008/0040537 A1 | 2/2008 | Kim | |
| 2008/0059694 A1 | 3/2008 | Lee | |
| 2008/0130156 A1 | 6/2008 | Chu et al. | |
| 2008/0177938 A1 | 7/2008 | Yu | |
| 2008/0222353 A1 | 9/2008 | Nam et al. | |
| 2008/0256287 A1 | 10/2008 | Lee et al. | |
| 2008/0307270 A1 | 12/2008 | Li | |
| 2009/0019218 A1 | 1/2009 | Sinclair et al. | |
| 2009/0031072 A1 | 1/2009 | Sartore | |
| 2009/0103203 A1 | 4/2009 | Yoshida | |
| 2009/0106518 A1 | 4/2009 | Dow | |
| 2009/0144501 A2 | 6/2009 | Yim et al. | |
| 2009/0150599 A1 | 6/2009 | Bennett | |
| 2009/0172324 A1 | 7/2009 | Han et al. | |
| 2009/0249168 A1 | 10/2009 | Inoue | |
| 2009/0271562 A1 | 10/2009 | Sinclair | |
| 2009/0327603 A1 | 12/2009 | McKean et al. | |
| 2010/0088459 A1 | 4/2010 | Arya et al. | |
| 2011/0119560 A1 * | 5/2011 | Lee et al. | 714/758 |
| 2011/0302477 A1 * | 12/2011 | Goss et al. | 714/773 |

OTHER PUBLICATIONS

Gokul Soundararajan, Vijayan Prabhakaran, Mahesh Balakrishan, Ted Wobber, "Extending SSD Lifetimes with Disk-Based Write Caches", http://research.microsoft.com/pubs/115352/hybrid.pdf, Feb. 2010.

Xiaojian Wu, A. L Narasimha Reddy, "Managing Storage Space in a Flash and Disk Hybrid Storage System", http://www.ee.tamu.edu/~reddy/papers/mascots09.pdf.

Tao Xie, Deepthi Madathil, "SAIL: Self-Adaptive File Reallocation on Hybrid Disk Arrays", The 15th Annual IEEE International Conference on High Performance Computing (HiPC 2008), Bangalore, India, Dec. 17-20, 2008.

Non-Volatile Memory Host Controller Interface revision 1.0 specification available for download at http://www.intel.com/standards/nvmhci/index.htm. Ratified on Apr. 14, 2008, 65 pages.

U.S. Appl. No. 12/720,568, filed Mar. 9, 2010, 22 pages.

* cited by examiner

HYBRID DRIVE WRITING EXTENDED ERROR CORRECTION CODE SYMBOLS TO DISK FOR DATA SECTORS STORED IN NON-VOLATILE SEMICONDUCTOR MEMORY

CROSS-REFERENCE TO RELATED APPLICATIONS

The present application claims priority from co-pending provisional U.S. Patent Application Ser. No. 61/378,869, filed on Aug. 31, 2010, the specification of which is incorporated herein by reference.

BACKGROUND

Hybrid drives are conventional disk drives augmented with a non-volatile semiconductor memory (NVSM) such as a flash which helps improve certain aspects of the disk drive. For example, the non-volatile semiconductor memory may store boot data in order to expedite the boot operation of a host computer. Another use of a NVSM may be to store frequently accessed data and/or non-sequential data for which the access time is typically much shorter than the disk (which suffers from mechanical latency including seek and rotational latency). Other policies may reduce write amplification of the NVSM in order to maximize its longevity, such as storing frequently written data to the disk (or data having a write/read ratio that exceeds a predetermined threshold).

DETAILED DESCRIPTION OF EMBODIMENTS OF THE INVENTION

Figure 1:
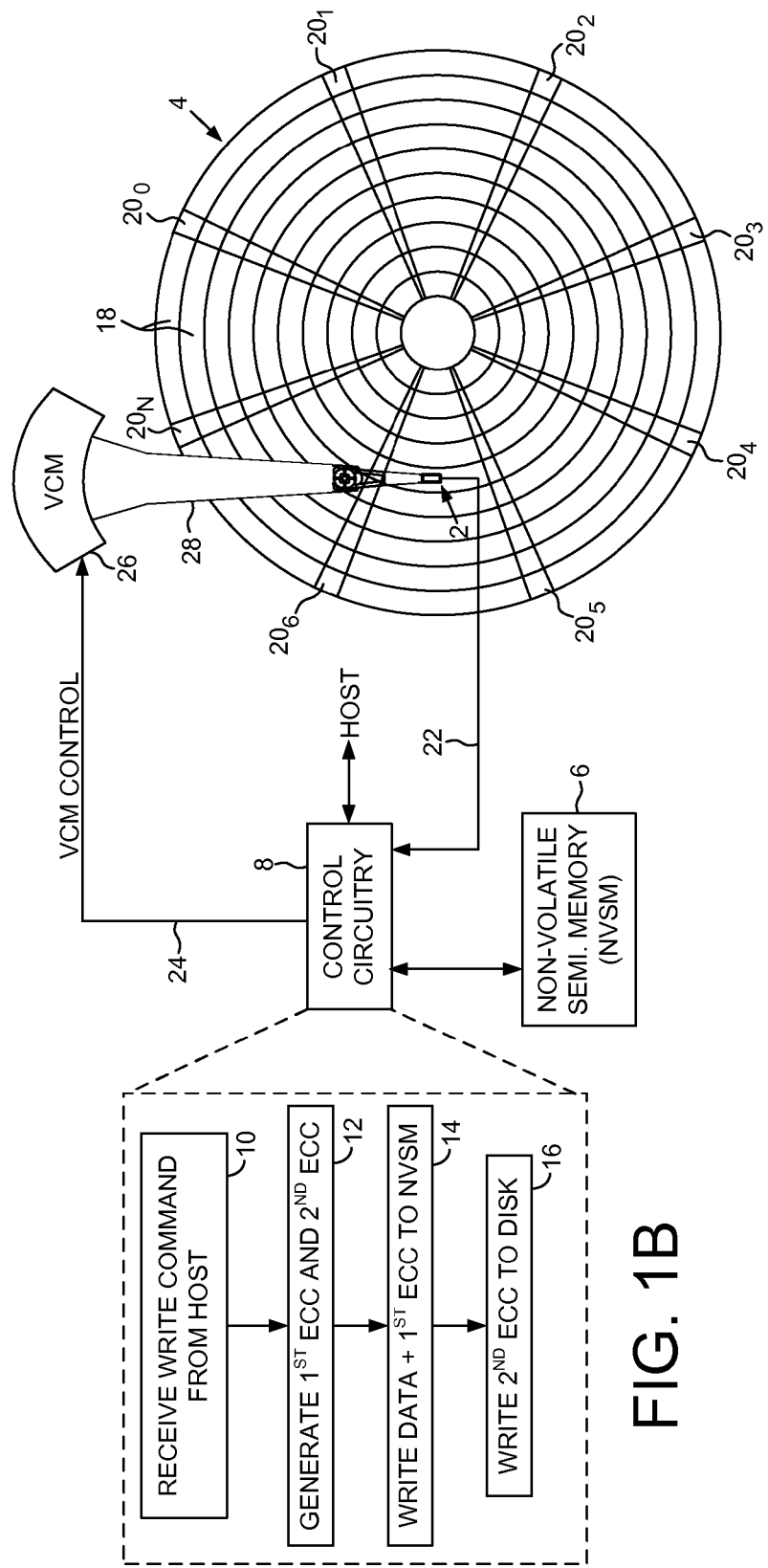
FIG. 1A shows a hybrid drive according to an embodiment of the present invention comprising a head actuated over a disk, and a non-volatile semiconductor memory (NVSM).
FIG. 1B is a flow diagram according to an embodiment of the present invention wherein extended error correction code (ECC) symbols are written to the disk for a data sector written to the NVSM.

FIG. 1A shows a hybrid drive according to an embodiment of the present invention comprising a head 2 actuated over a disk 4, and a non-volatile semiconductor memory (NVSM) 6. The hybrid drive further comprises control circuitry 8 operable to execute the flow diagram of FIG. 1B wherein a write command is received from a host (step 10), the write command comprising data. First and second error correction code (ECC) symbols are generated over the data (step 12), wherein the second ECC symbols are different than the first ECC symbols. The data and first ECC symbols are written to the NVSM (step 14), and the second ECC symbols are written to the disk (step 16).

In the embodiment of FIG. 1A, any suitable NVSM 6 may be employed, such as any suitable electrically erasable/programmable memory (e.g., a flash memory). In one embodiment, the NVSM 6 comprises a plurality of blocks, where each block comprises a plurality of memory segments referred to as pages, and each page may store one or more data sectors. The blocks are programmed a page at a time, and an entire block is erased in a unitary operation.

The disk 4 shown in the embodiment of FIG. 1A comprises a plurality of data tracks 18 defined by servo sectors $20_0$-$20_N$, wherein each data track comprises a plurality of data sectors accessed indirectly through a logical block address (LBA). The control circuitry 8 processes a read signal 22 emanating from the head 2 to demodulate the servo sectors $20_0$-$20_N$ into a position error signal (PES) representing a position error of the head relative to a target data track. The control circuitry 8 comprises a servo compensator for filtering the PES to generate a control signal 24 applied to a voice coil motor (VCM) 26 that rotates an actuator arm 28 about a pivot in order to actuate the head 2 radially over the disk 4 in a direction that reduces the PES.

The NVSM 6 is typically accessed faster than the disk 4, particularly for non-sequential access commands where accessing the disk involves a seek latency of the head and a rotational latency of the disk. Therefore, the NVSM 6 typically improves the performance of a hybrid drive as compared to a conventional disk drive. However, the size of the NVSM 6 is typically limited to reduce cost, thereby limiting the performance benefit. In addition, the reliability of recorded data is a significant concern whether stored on the disk or the NVSM. To increase reliability, data is typically recorded with ECC symbols that enable the detection and correction of errors during read operations. However, the ECC symbols are overhead that decreases the storage capacity of the storage medium, and in the case of the NVSM, reduces the performance benefit.

Accordingly, in an embodiment of the present invention, when data is written to the NVSM a first number of ECC symbols are generated for detecting and correcting a first number of errors during read operations, and a second (greater) number of ECC symbols are generated for detecting and correcting a second (greater) number of errors. This embodiment is understood with reference to the flow diagram of FIG. 2, wherein when a read command is received from the host (step 30) and the data is stored in the NVSM (step 32), the data and first ECC symbols are read from the NVSM (step 34). If the data sector is unrecoverable using the first ECC symbols (step 36), the second ECC symbols are read from the disk (step 38) and used to recover the data (step 40).

In one embodiment, the first number of ECC symbols is small enough to increase the user data capacity of the NVSM, but large enough to ensure the correction power is sufficient most of the time to avoid the performance degradation due to accessing the disk to read the second ECC symbols. In one embodiment, the second ECC symbols for a number of the NVSM data sectors may be cached in a volatile semiconductor memory (e.g., RAM) to avoid the latency in accessing the disk. For example, in one embodiment the second ECC symbols for the most frequently read (or most recently read) NVSM data sectors may be read from the disk and cached in a RAM as part of the normal operation of the hybrid drive.

Any suitable ECC algorithm may be employed to generate the first and second ECC symbols. In one embodiment, a suitable polynomial code (e.g., a Reed-Solomon code) may be used to generate both the first and second ECC symbols. This embodiment is understood with reference to FIG. 3A wherein a first generator polynomial is used to generate the first ECC symbols appended to the NVSM data sectors, and a second (longer) generator polynomial is used to generate the second ECC symbols. In the embodiment shown in FIG. 3A, the second ECC symbols generated for a number of NVSM data sectors may be written to a single disk data sector, wherein third ECC symbols may be generated for appending to the disk data sector. In one embodiment, the second ECC symbols are accumulated in a RAM data sector until the RAM data sector is full, and then the RAM data sector is written to the disk data sector (together with the third ECC symbols). If a power failure occurs prior to flushing the RAM data sector to the disk, the RAM data sector may be rebuilt when the hybrid drive is powered on.

Figure 3A:
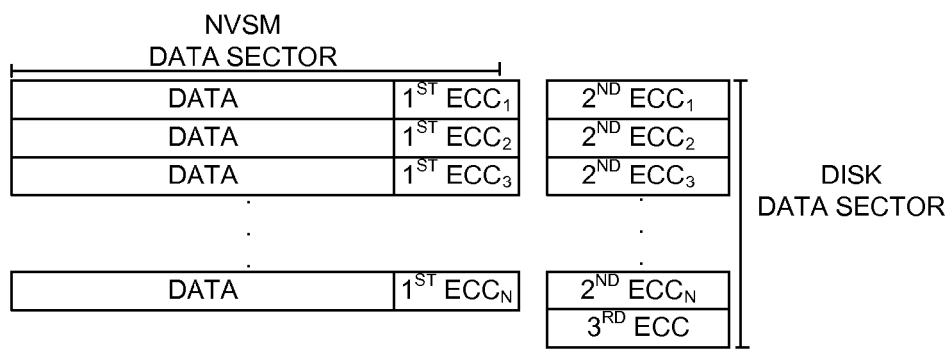
FIG. 3A shows an embodiment of the present invention wherein extended ECC symbols generated for multiple NVSM data sectors are written to a disk data sector.
Figure 3B:
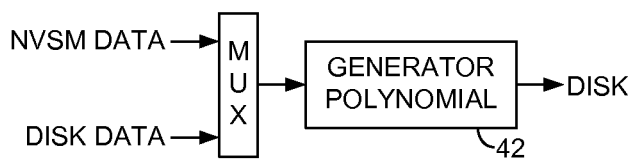
FIG. 3B shows an embodiment of the present invention wherein the same generator polynomial may be used to generate the extended ECC symbols for an NVSM data sector and the ECC symbols for a disk data sector.

In one embodiment, the number of second ECC symbols generated for an NVSM data sector equals the number of third ECC symbols generated for a disk data sector as illustrated in FIG. 3A. Referring to FIG. 3B, in one embodiment the same generator polynomial 42 may be used to generate both the second ECC symbols for an NVSM data sector and the third ECC symbols for a disk data sector. Similarly, the same error detection and correction circuitry used to recover a disk data sector may be used to recover an NVSM data sector that is unrecoverable using the first ECC symbols.

Figure 4A:
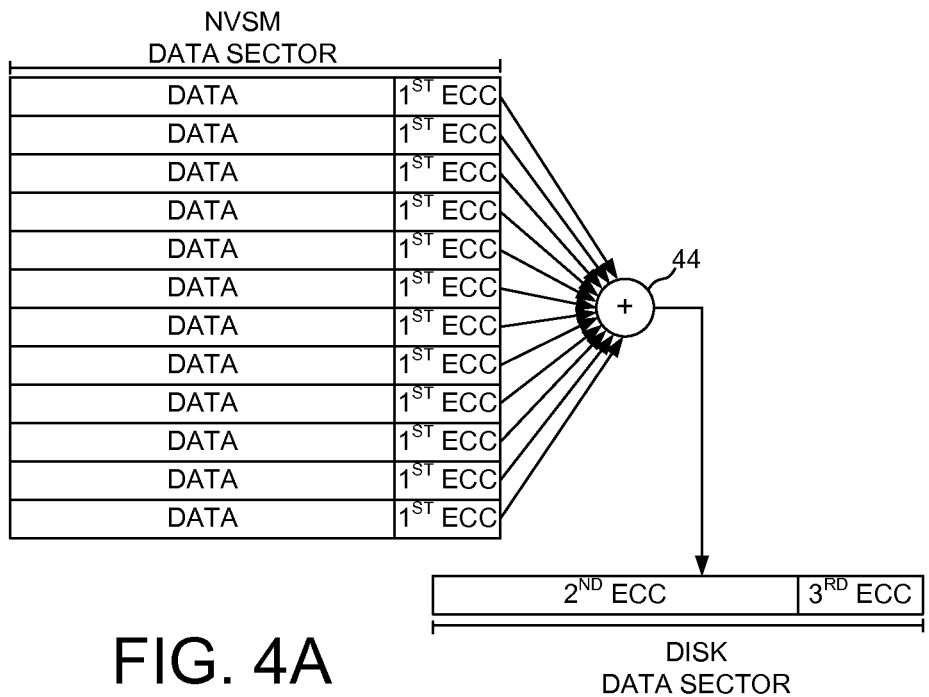
FIG. 4A shows an embodiment of the present invention wherein the extended ECC symbols comprise a parity sector generated over multiple NVSM data sectors.

FIG. 4A shows an embodiment of the present invention wherein the NVSM comprises a plurality of NVSM data sectors including a first and second NVSM data sector. Each NVSM data sector comprises data and first ECC symbols, and the second ECC symbols are generated over the data of at least the first and second NVSM data sectors. In the example of FIG. 4A, the second ECC symbols are generated over twelve NVSM data sectors; however, the second ECC symbols may be generated over any suitable number of NVSM data sectors. The second ECC symbols may be generated using any suitable algorithm, wherein in the example shown in FIG. 4A, the second ECC symbols are generated as a parity 44 over the data of the NVSM data sectors. When the parity information (second ECC symbols) is written to the disk, the third ECC symbols are written to the disk to protect the parity information.

Figure 4B:
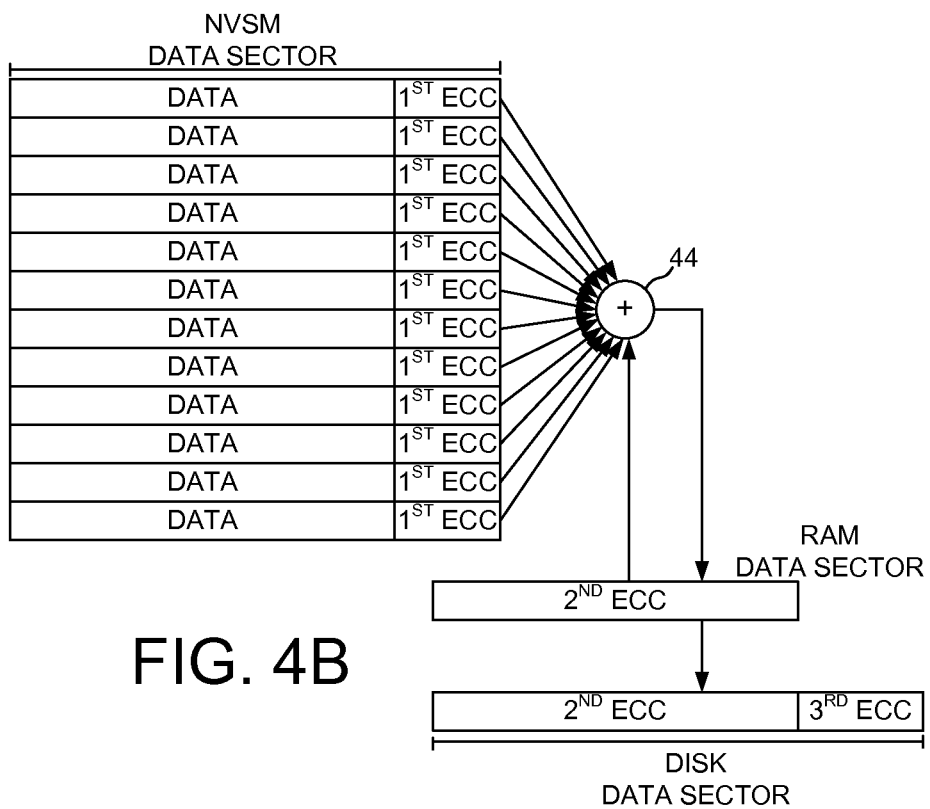
FIG. 4B shows an embodiment of the present invention wherein a parity data sector is generated in a volatile semiconductor memory (RAM) during write operations to the NVSM.
Figure 5:
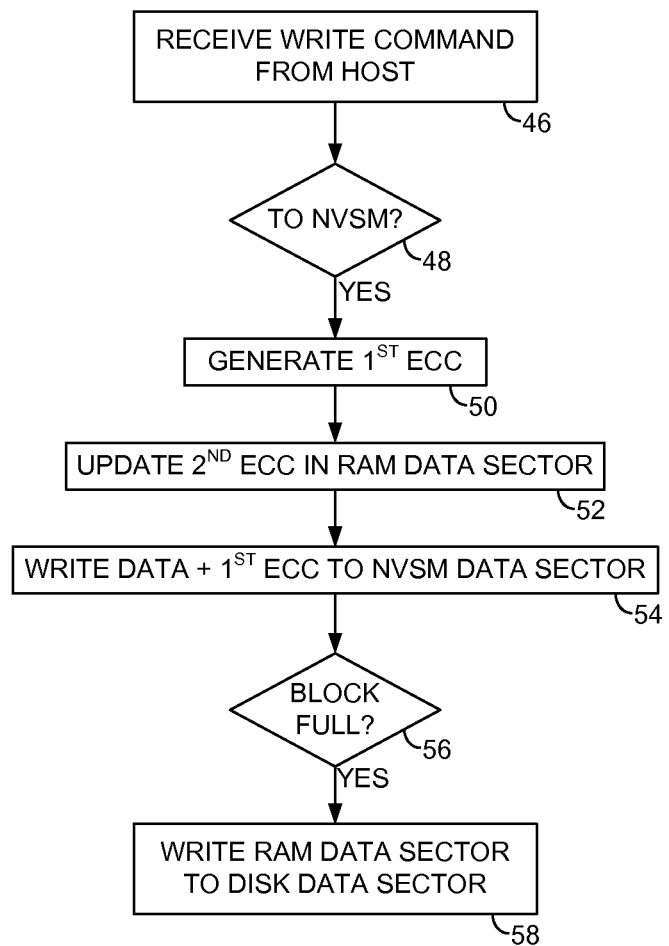
FIG. 5 is a flow diagram according to an embodiment of the present invention wherein the parity sector is flushed to the disk when full.

FIG. 4B shows an embodiment wherein the second ECC symbols (parity) are generated over multiple NVSM data sectors as each NVSM data sector is written, and the result stored in a RAM data sector which is then flushed to the disk when full. This embodiment is understood with reference to the flow diagram of FIG. 5 wherein when a write command is received from a host (step 46) and the write command is routed to the NVSM (step 48), the first ECC symbols are generated (step 50) and the second ECC symbols in the RAM data sector are updated (step 52) using the data in the write command. The data and the first ECC symbols are then written to an NVSM data sector (step 54). In one embodiment, the RAM data sector stores the parity of the NVSM data sectors, wherein the RAM data sector is updated each time a new NVSM data sector is written by combining the previous contents of the RAM data sector with the new write data. When the target number of NVSM data sectors have been written meaning that the RAM data sector is full (step 56), the RAM data sector is written to the disk (step 58) together with the third ECC symbols generated for the disk data sector. If a power failure occurs before the RAM data sector is flushed to the disk, the RAM data sector may be rebuilt when the hybrid drive is powered on.

In one embodiment, a parity data sector is generated for each block of memory in the NVSM, and the parity sector is flushed to the disk when a current open block is filled with data. A new parity sector is then started for the next block opened. In other embodiments, multiple parity sectors may be generated for each block, and in an embodiment described below with reference to FIG. 8B, multiple parity sectors may be generated in multiple dimensions over multiple blocks.

Figure 6A:
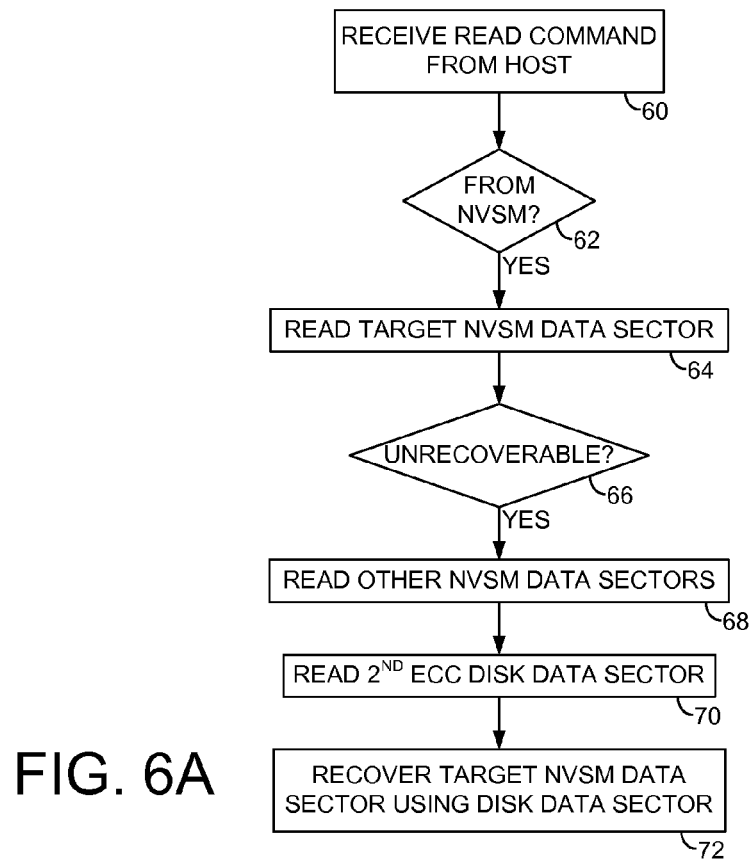
FIG. 6A is a flow diagram according to an embodiment of the present invention wherein when a NVSM data sector is unrecoverable, the other NVSM data sectors are combined with the disk parity sector to recover the NVSM data sector.
Figure 6B:
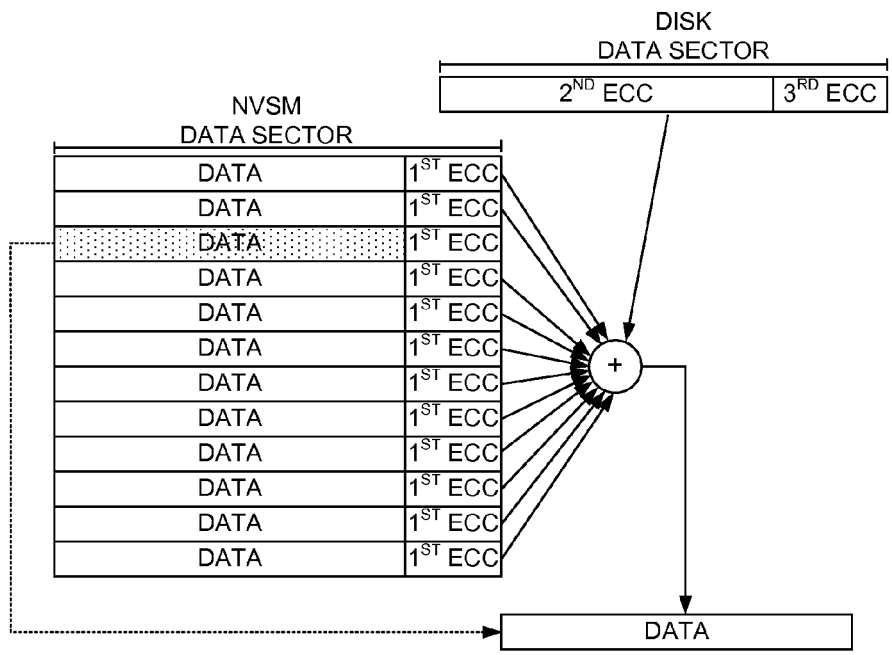
FIG. 6B shows an embodiment of the present invention for recovering an NVSM data sector using the disk parity sector.

FIG. 6A is a flow diagram according to an embodiment of the present invention which is further understood with reference to FIG. 6B. When a read command is received from the host (step 60) and the data is stored in the NVSM (step 62), the target NVSM data sector is read (step 64). If the NVSM data sector is unrecoverable using the first ECC symbols (step 66), the other NVSM data sectors corresponding to the parity sector are read (step 68) and the parity sector (second ECC symbols) is read from the disk (step 70). The target NVSM data sector is then recovered by combining the other NVSM data sectors and the parity sector (step 72).

Figure 7A:
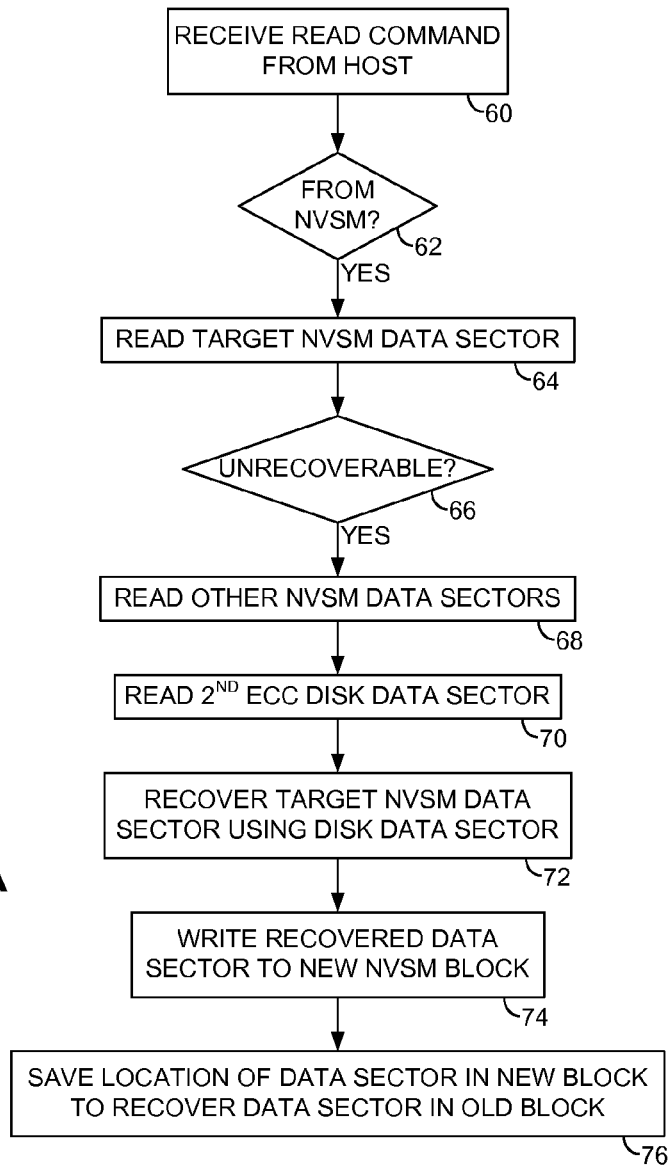
FIGS. 7A and 7B show an embodiment of the present invention wherein a recovered NVSM data sector is written to a new block and used to generate the disk parity sector for the old block and the new block.
Figure 7B:
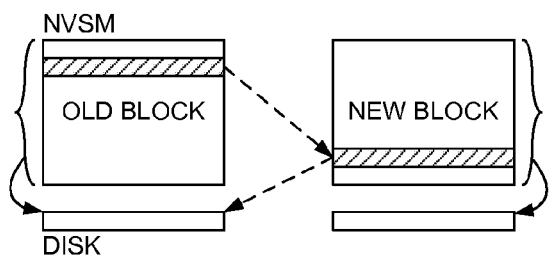

FIG. 7A is a flow diagram according to an embodiment of the present invention which extends on the flow diagram of FIG. 6A. In this embodiment, if a parity sector is needed to recover a target NVSM data sector (step 72), the recovered data is written to a new NVSM data sector in a new NVSM block (step 74) as illustrated in FIG. 7B. The location of the new NVSM data sector in the new block is saved so that it can be used to recover other data sectors in the old block when needed (step 76). In an alternative embodiment, the parity sector may be regenerated for the old block minus the relocated NVSM data sector, although this embodiment requires the regenerated parity sector to be saved to the disk.

Figure 8A:
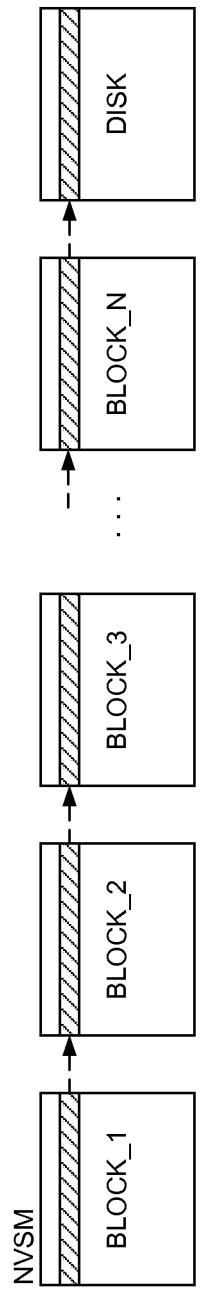
FIG. 8A shows an embodiment of the present invention wherein the disk parity sector is generated over NVSM data sectors from different blocks.

FIG. 8A shows an embodiment of the present invention wherein the NVSM comprises a plurality of blocks, each block comprises a plurality of NVSM data sectors, and each block is erasable in a unitary operation. A first block comprises a first NVSM data sector and a second block comprises a second NVSM data sector, wherein a parity sector is generated over at least the first and second NVSM data sectors (illustrated as a horizontal combination of the NVSM data sectors across multiple blocks). In this embodiment, if an entire block of the NVSM becomes unrecoverable the NVSM data sectors of the bad block may still be recovered using the parity sectors stored on the disk (assuming the other NVSM blocks are recoverable).

Figure 8B:
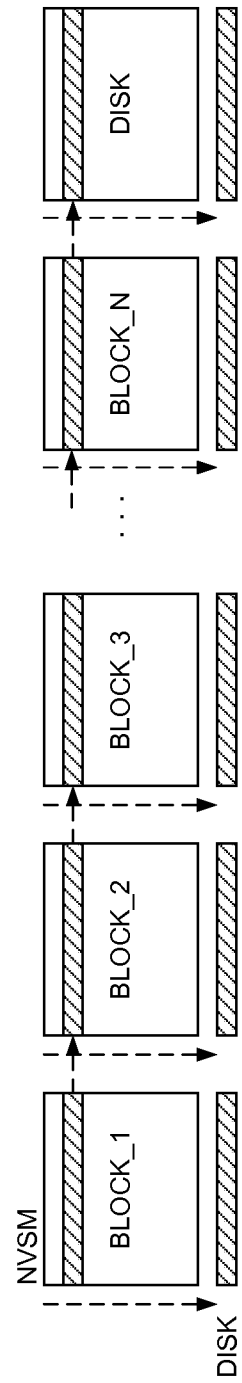
FIG. 8B shows an embodiment of the present invention wherein disk parity sectors are generated in two dimensions which enables recovering up to two NVSM data sectors per block.

FIG. 8B shows an embodiment of the present invention wherein disk parity sectors are generated in two dimensions which enables recovering up to two NVSM data sectors per block. In the example shown in FIG. 8B, a first disk parity sector is generated over at least a first NVSM data sector of a first block and a second NVSM data sector of a second block (horizontal direction). A second disk parity sector is generated over the first NVSM block (vertical direction) and a third parity sector is generated over the second NVSM block (vertical direction) and so on. This embodiment enables the recovery of up to two NVSM data sectors per block unrecoverable using the first ECC symbols.

Figure 2:
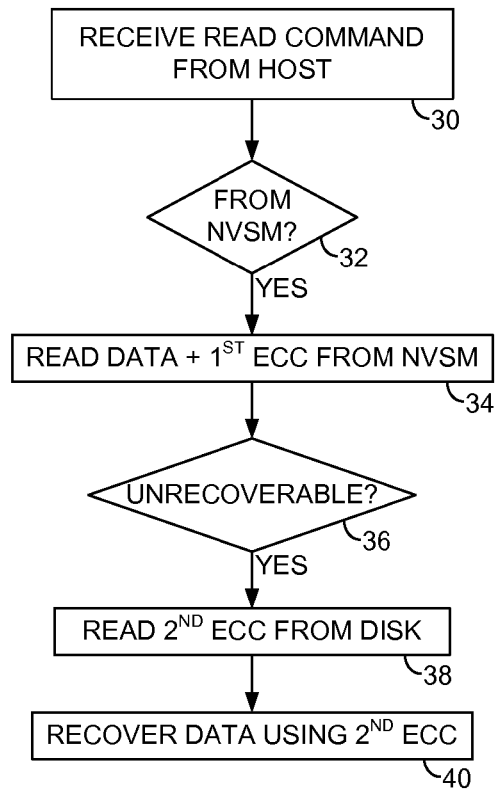
FIG. 2 is a flow diagram according to an embodiment of the present invention wherein when a data sector is unrecoverable from the NVSM, the extended ECC symbols on the disk are used to recover the data sector.
Figure 9:
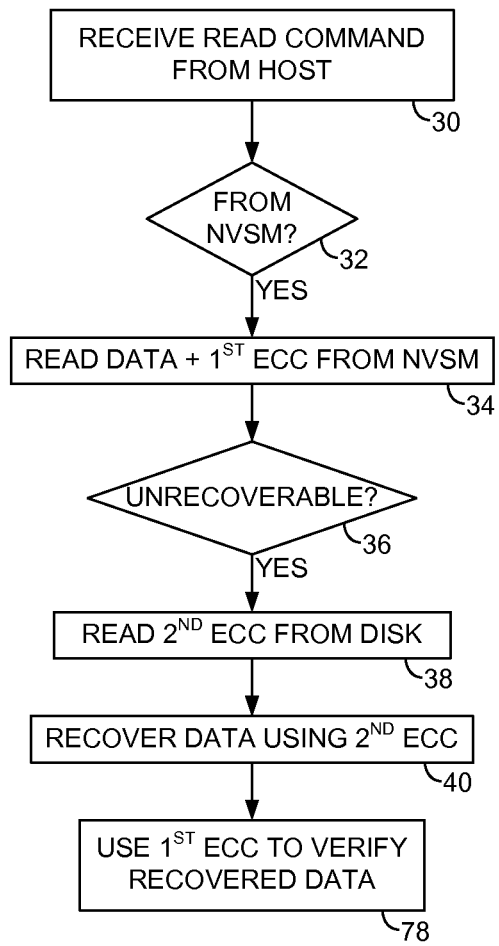
FIG. 9 is a flow diagram according to an embodiment of the present invention wherein the first ECC symbols are used to verify the data recovered using the second ECC symbols.

FIG. 9 is a flow diagram according to an embodiment of the present invention which expands on the flow diagram of FIG. 2, wherein after recovering data using the second ECC symbols (step 40) the recovered data is verified using the first ECC symbols read from the NVSM data sector (step 78). This embodiment assumes that the first ECC symbols are recoverable from the NVSM data sector. When the second ECC symbols are used to recover the data, the first ECC symbols can be used to verify that the NVSM data sector no longer contains errors. If the second ECC symbols incorrectly recover the data (e.g., if the wrong parity sector or a corrupted parity sector is used to recover data), the first ECC symbols will detect the invalidity of the recovered data.

In one embodiment, the number of times the second ECC symbols are needed to recover an NVSM data sector is used to determine when to retire a block in the NVSM. That is, the occurrence of unrecoverable NVSM data sectors may indicate an NVSM block is failing, and therefore the NVSM block is retired.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller and/or NVSM controller, or certain steps described above may be performed by a read channel and others by a disk controller and/or NVSM controller. In one embodiment, the read channel and controllers are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into an SOC.

In one embodiment, the control circuitry comprises a microprocessor executing instructions, the instructions being operable to cause the microprocessor to perform the steps of the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the hybrid drive is powered on. In yet another embodiment, the control circuitry comprises suitable logic circuitry, such as state machine circuitry.

What is claimed is:

1. A hybrid drive comprising:
a disk;
a head actuated over the disk;
a non-volatile semiconductor memory (NVSM); and
control circuitry operable to:
  receive a write command from a host, the write command comprising data;
  generate first error correction code (ECC) symbols over the data;
  generate second ECC symbols over the data, wherein the second ECC symbols are different than the first ECC symbols;
  write the data and first ECC symbols to the NVSM; and
  write the second ECC symbols to the disk.

2. The hybrid drive as recited in claim 1, wherein the control circuitry is further operable to:
receive a read command from the host to read the data from the NVSM; and
when the data is unrecoverable from the NVSM using the first ECC symbols, recover the data using the second ECC symbols.

3. The hybrid drive as recited in claim 2, wherein the control circuitry is further operable to verify the recovered data using the first ECC symbols.

4. The hybrid drive as recited in claim 1, wherein:
the NVSM comprises a plurality of NVSM data sectors;
the disk comprises a plurality of disk data sectors;
each NVSM data sector comprises data and the first ECC symbols; and
the control circuitry is operable to write a plurality of the second ECC symbols generated over the data of a plurality of the NVSM data sectors to a disk data sector.

5. The hybrid drive as recited in claim 4, wherein the control circuitry is further operable to:
generate third ECC symbols over the second ECC symbols, wherein a number of the second ECC symbols equals a number of the third ECC symbols; and
write the third ECC symbols to the disk data sector.

6. The hybrid drive as recited in claim 5, wherein the control circuitry is further operable to generate the second and third ECC symbols using the same generator polynomial.

7. The hybrid drive as recited in claim 1, wherein:
the NVSM comprises a plurality of NVSM data sectors including a first and second NVSM data sector;
each NVSM data sector comprises data and first ECC symbols; and
the second ECC symbols are generated over the data of at least the first and second NVSM data sectors.

8. The hybrid drive as recited in claim 7, wherein the second ECC symbols are generated by computing a parity over the data of at least the first and second NVSM data sectors.

9. The hybrid drive as recited in claim 7, wherein the control circuitry is further operable to:
receive a read command from the host to read the first NVSM data sector; and
when the first NVSM data sector is unrecoverable using the first ECC symbols, recover the data of the first NVSM data sector using the second ECC symbols and the second NVSM data sector.

10. The hybrid drive as recited in claim 7, wherein the control circuitry is further operable to:
write the data recovered for the first NVSM data sector to a third NVSM data sector;
receive a read command from the host to read the second NVSM data sector; and
when the second NVSM data sector is unrecoverable using the first ECC symbols, recover the data of the second NVSM data sector using the second ECC symbols and the third NVSM data sector.

11. The hybrid drive as recited in claim 9, wherein:
the NVSM comprises a plurality of blocks, wherein each block comprises a plurality of NVSM data sectors and each block is erasable in a unitary operation; and
a first block comprises the first and second NVSM data sectors.

12. The hybrid drive as recited in claim 9, wherein:
the NVSM comprises a plurality of blocks, wherein each block comprises a plurality of NVSM data sectors and each block is erasable in a unitary operation;
a first block comprises the first NVSM data sector; and
a second block comprises the second NVSM data sector.

13. The hybrid drive as recited in claim 1, wherein:
the NVSM comprises a plurality of blocks including a first block and a second block, wherein each block comprises a plurality of NVSM data sectors and each block is erasable in a unitary operation;
the first block comprises first and third NVSM data sectors;
the second block comprises second and fourth NVSM data sectors;
the control circuitry is further operable to generate the second ECC symbols over the data of at least the first and third NVSM data sectors; and
the control circuitry is further operable to generate third ECC symbols over the data of at least the second and fourth NVSM data sectors, and write the third ECC symbols to the disk.

14. A method of operating a hybrid drive, the hybrid drive comprising a disk, a head actuated over the disk, and a non-volatile semiconductor memory (NVSM), the method comprising:
receive a write command from a host, the write command comprising data;
generating first error correction code (ECC) symbols over the data;
generating second ECC symbols over the data, wherein the second ECC symbols are different than the first ECC symbols;
writing the data and first ECC symbols to the NVSM; and
writing the second ECC symbols to the disk.

15. The method as recited in claim 14, further comprising:
receiving a read command from the host to read the data from the NVSM; and
when the data is unrecoverable from the NVSM using the first ECC symbols, recovering the data using the second ECC symbols.

16. The hybrid drive as recited in claim 15, further comprising verifying the recovered data using the first ECC symbols.

17. The method as recited in claim 14, wherein:
the NVSM comprises a plurality of NVSM data sectors;
the disk comprises a plurality of disk data sectors;
each NVSM data sector comprises data and the first ECC symbols; and
the method further comprises writing a plurality of the second ECC symbols generated over the data of a plurality of the NVSM data sectors to a disk data sector.

18. The method as recited in claim 17, further comprising:
generating third ECC symbols over the second ECC symbols, wherein a number of the second ECC symbols equals a number of the third ECC symbols; and
writing the third ECC symbols to the disk data sector.

19. The method as recited in claim 18, further comprising generating the second and third ECC symbols using the same generator polynomial.

20. The method as recited in claim 14, wherein:
the NVSM comprises a plurality of NVSM data sectors including a first and second NVSM data sector;
each NVSM data sector comprises data and first ECC symbols; and
the second ECC symbols are generated over the data of at least the first and second NVSM data sectors.

21. The method as recited in claim 20, wherein the second ECC symbols are generated by computing a parity over the data of at least the first and second NVSM data sectors.

22. The method as recited in claim 20, further comprising:
receiving a read command from the host to read the first NVSM data sector; and
when the first NVSM data sector is unrecoverable using the first ECC symbols, recovering the data of the first NVSM data sector using the second ECC symbols and the second NVSM data sector.

23. The method as recited in claim 22, further comprising:
writing the data recovered for the first NVSM data sector to a third NVSM data sector;
receiving a read command from the host to read the second NVSM data sector; and
when the second NVSM data sector is unrecoverable using the first ECC symbols, recovering the data of the second NVSM data sector using the second ECC symbols and the third NVSM data sector.

24. The method as recited in claim 22, wherein:
the NVSM comprises a plurality of blocks, wherein each block comprises a plurality of NVSM data sectors and each block is erasable in a unitary operation; and
a first block comprises the first and second NVSM data sectors.

25. The method as recited in claim 22, wherein:
the NVSM comprises a plurality of blocks, wherein each block comprises a plurality of NVSM data sectors and each block is erasable in a unitary operation;
a first block comprises the first NVSM data sector; and
a second block comprises the second NVSM data sector.

26. The method as recited in claim 14, wherein:
the NVSM comprises a plurality of blocks including a first block and a second block, wherein each block comprises a plurality of NVSM data sectors and each block is erasable in a unitary operation;
the first block comprises first and third NVSM data sectors;
the second block comprises second and fourth NVSM data sectors;
the method further comprises generating the second ECC symbols over the data of at least the first and third NVSM data sectors, and writing the third ECC symbols to the disk; and
the method further comprises generating third ECC symbols over the data of at least the second and fourth NVSM data sectors, and writing the third ECC symbols to the disk.

* * * * *